United States Patent [19]

Shimizu

[11] Patent Number: 5,767,540
[45] Date of Patent: Jun. 16, 1998

[54] HETERO-JUNCTION BIPOLAR TRANSISTOR HAVING ALGAASP EMITTER LAYER UNDERNEATH A BASE ELECTRODE

[75] Inventor: Masafumi Shimizu, Nara-ken, Japan

[73] Assignee: Sharp Kabushiki Kaisha, Osaka, Japan

[21] Appl. No.: 605,539

[22] Filed: Feb. 22, 1996

Related U.S. Application Data

[63] Continuation of Ser. No. 197,945, Feb. 16, 1994, abandoned.

[30] Foreign Application Priority Data

Feb. 17, 1993 [JP] Japan ................................ 5-027853

[51] Int. Cl.$^6$ .................. H01L 29/20; H01L 29/06; H01L 31/0304; H01L 35/26
[52] U.S. Cl. ............... 257/197; 257/76; 257/191; 257/196; 257/615; 257/623
[58] Field of Search ................ 257/11, 12, 76, 257/183, 187, 189, 191, 196, 197, 198, 615, 623

[56] References Cited

U.S. PATENT DOCUMENTS

| | | | |
|---|---|---|---|
| 5,132,764 | 7/1992 | Bayraktaroglu | 257/198 |
| 5,298,439 | 3/1994 | Liu et al. | 437/31 |
| 5,345,097 | 9/1994 | Nakagawa | 257/187 |
| 5,412,233 | 5/1995 | Dubon-Chevallier et al. | 257/197 |

OTHER PUBLICATIONS

Zwicknagl et al., "High–Speed Non–Self Aligned GaZnp/GaAs–TEBT", Electronics Letters, vol. 28, No. 3, Jan. 30, 1992, pp. 327–328.

Takahashi et al., "High–Reliability InGaP/GaAs HBTs Fabricated by Self–Aligned Process" *IEDM 94* (Dec. 1994) pp. 191–194.

Japanese Laid–Open Patent No. HEI 2–98937 (11 Apr. 1990).

Lu, S.S., "High–Current–Gain $Ga_{0.51}In_{0.49}P$/GaAs Heterojunction Bipolar Transistor Grown by Gas–Source Molecular Beam Epitaxy" *IEEE Electron Device Letters* (1992) 13(4):214–216.

*Primary Examiner*—Carl W. Whitehead
*Assistant Examiner*—Alice W. Tang
*Attorney, Agent, or Firm*—Morrison & Foerster LLP

[57] ABSTRACT

A hetero-junction bipolar transistor comprising a collector layer, a base layer and an emitter layer formed stepwise in this order wherein the emitter layer comprises a plurality of layers including an AlGaAs layer, and a passivation layer is formed at a stepwise portion between the base layer and the emitter layer, and of a material having a bandgap larger than that of the base layer, and provided with a phosphide layer on the surface thereof.

7 Claims, 5 Drawing Sheets

HETERO-JUNCTION BIPOLAR TRANSISTOR HAVING ALGAASP EMITTER LAYER UNDERNEATH A BASE ELECTRODE

This application is a continuation of application Ser. No. 08/197,945, filed Feb. 16, 1994, now abandoned.

BACKGROUND OF THE INVENTION

1. Field of the Invention

This invention relates to hetero-junction bipolar transistors (HBT's). More particularly it relates to an AlGaAs/GaAs type HBT and an AlGaAs/InGaP/GaAs type HBT formed on a GaAs substrate.

2. Description of the Related Art

Conventionally known are HBT's of two kinds, namely a PNP-type HBT and an NPN-type HBT depending on the combination of dopants doping in an emitter layer, a collector layer and a base layer. The NPN-type HBT will be detailed hereinbelow.

One of the most important issues in putting HBT's to a practical use is to improve the reliability thereof by securing a current gain.

Generally speaking, standard HBT's provide a base layer having a dopant concentration of not less than $1 \times 10^{19}$ cm$^{-3}$ which is intended to decrease a resistance in the base layer. It is known, however, that, for example, HBT's to which beryllium (Be) is doped to generate an unusual diffusion of Be in operation thereby varying an on-voltage of an emitter-base junction and at the same time causing a drop in the current gain. On the other hand, HBT's using carbon as a dopant doping a base layer does not generate an unusual diffusion of the dopant at the base layer. This allows setting to a high level a dopant concentration in the base layer which can decrease a resistance in the base layer. Consequently it has been believed that HBT's doped with carbon is superior to HBT's doped with Be in an overall evaluation. It has been much expected that HBT's doped with carbon will be put to a practical use.

On the other hand, in HBT's with a standard element structure, an emitter layer has a graded composition such as $Al_xGa_{1-x}As$ (x represents a mixed crystal ratio). The surface of such emitter layer contains a large amount of crystal defects. The presence of such crystal defects increases the recombination of carriers (so-called surface recombination).

Figure 3:
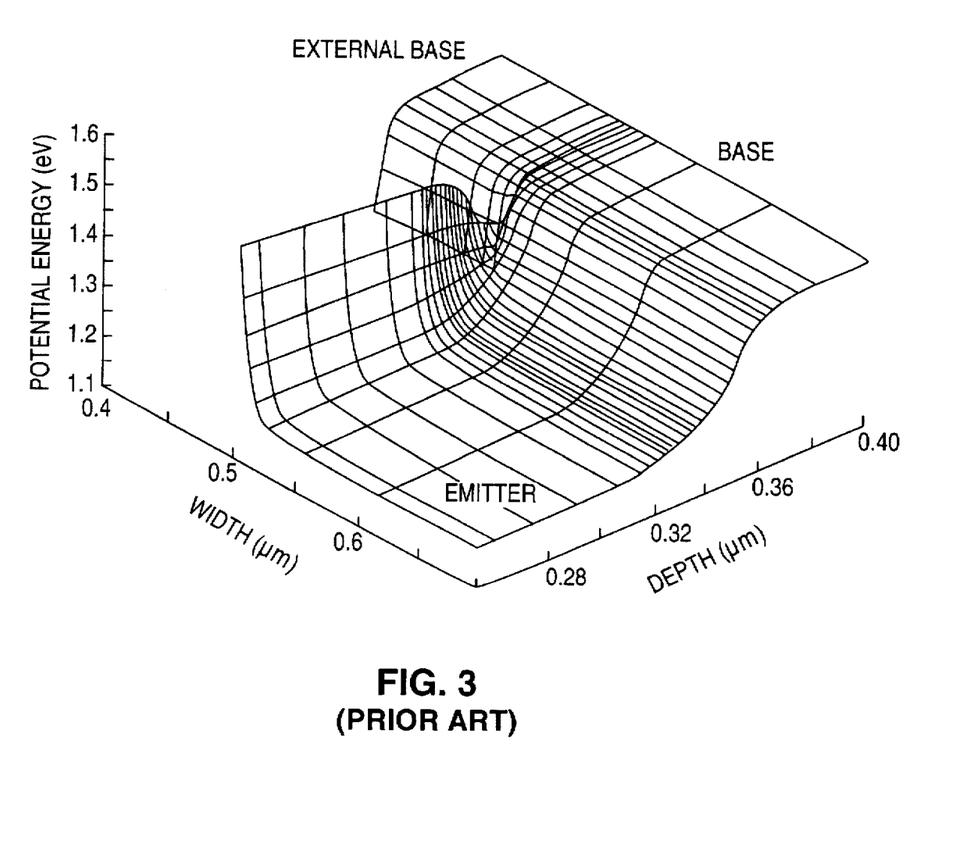
FIG. 3 is a model view of an emitter base conduction band potential energy to show that carriers can easily flow through the surface channel of a HBT having a base layer with a uniform composition and an emitter layer with a graded composition.
Figure 4:
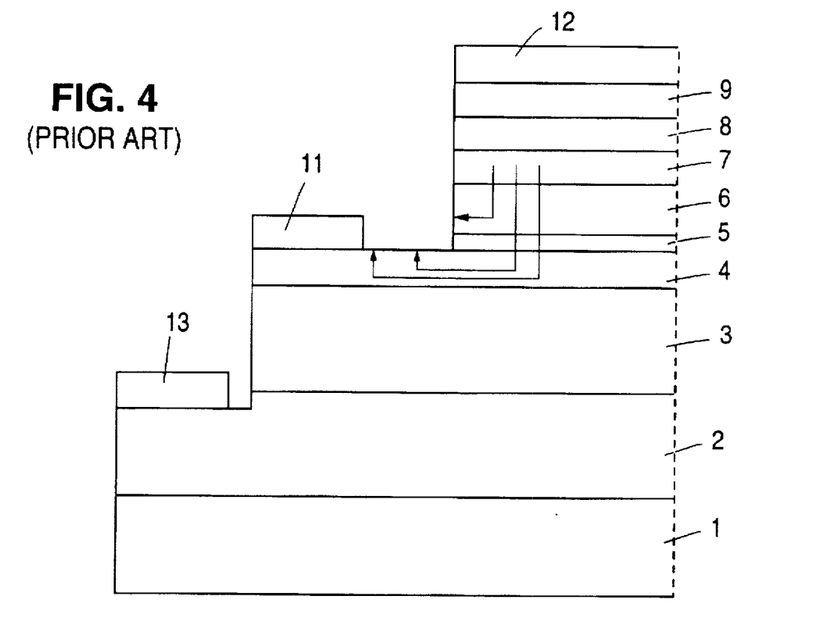
FIG. 4 is a structural sectional view of FIG. 3.

Such emitter layer is also liable to allow carriers (electrons) to flow into a surface channel generated from a Fermi level pining. This ultimately causes a problem that the base current increases and the current gain (=(collector current)/(base current) ratio) decreases (refer to FIG. 3 and FIG. 4).

The drawback has been largely improved with the introduction of what is called a guard ring structure in which the periphery of a joint between the emitter layer and the base layer are covered and part of the AlGaAs emitter layer is retained as a depletion layer which is then utilized as a passivation.

As another way of improving the above drawback, there has been proposed a method for securing a current gain which method involves adopting a graded composition in the base layer to form an electric field in which electrons are transferred from the emitter side to the collector side in the base layer, and suppressing an effect of the surface recombination to secure a current gain. Furthermore there has been reported quite recently HBT's in which an InGaP layer is adopted as an emitter layer (see Japanese Laid-Open Patent No. HEI 2-98937).

Figure 5:
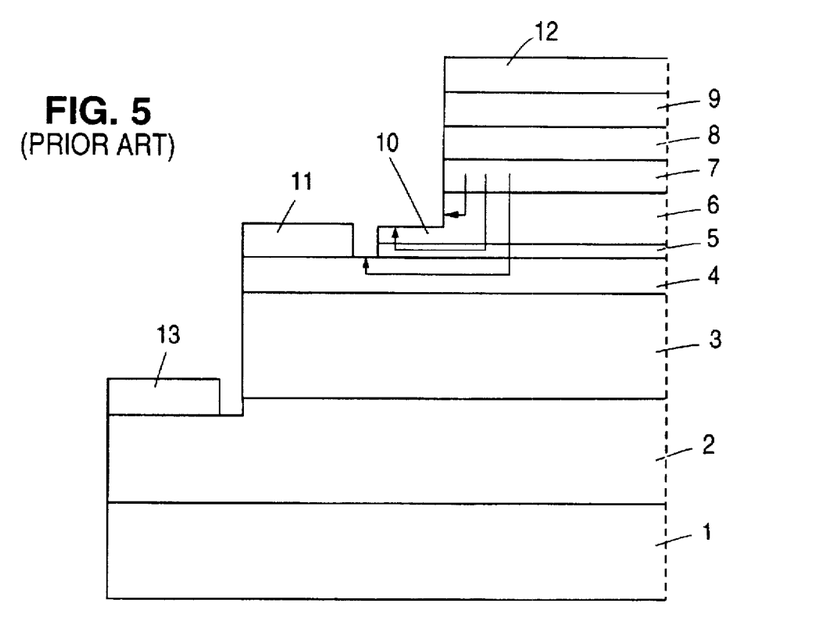
FIG. 5 is a structural sectional view of an AlGaAs/GaAs HBT with a general guard ring structure.

FIG. 5 shows an AlGaAs/GaAs type HBT with a standard guard ring structure. Referring to FIG. 5, Reference Numeral 1 designates a semi-insulating GaAs substrate, 2 an N-type GaAs sub-collector layer, 3 an N-type GaAs collector layer, 4 a P-type GaAs base layer, 5 an N-type $Al_xGa_{1-x}As$ graded composition (x is from 0 to 0.3) emitter layer, 6 an N-type AlGaAs emitter layer, 7 an N-type $Al_xGa_{1-x}As$ graded composition (x is from 0.3 to 0), 8 an N-type GaAs cap layer, 9 an N-type InGaAs contact layer, 10 a AlGaAs passivation layer having a guard ring structure, 11 a base electrode, 12 an emitter electrode, and 13 a collector electrode.

Here, an HBT as shown in FIG. 5 provides on the surface of a base layer an AlGaAs passivation layer 10 with a guard ring structure. The surface depletion layer of this layer 10 allows suppressing the outflow of a few number of carriers onto the surface of the AlGaAs passivation layer 10. Thus the HBT has a structure that can decrease the surface recombination current compared with the conventional counterpart.

However, it is known that in the case of the current density of $1 \times 10^4$ Acm$^{-2}$ or more the deterioration of current gain is resulted from a gradual increase in current owing to the surface recombination of the base layer in a long-time high temperature operation test even if a guard ring structure is adopted. That is because a delicate balance between the surface level density of the AlGaAs layer, the thickness of the AlGaAs layer and the carrier concentration serves to maintain the action of suppressing the surface recombination in the guard ring structure. For example, a loss of the balance owing to a change in the surface level produced by oxidation of the GaAs layer or the AlGaAs layer and a crystal defect generating from the recombination current is liable to increase the surface recombination current, which will ultimately result in deteriorating the current gain. The current gain is deteriorated even when a graded composition is introduced into the above base layer. In other words, a change in the surface level owing to the oxidation of the GaAs layer or AlGaAs layer surface or a crystal defect generated from the recombination current induces an increase in the current (the arrow in FIG. 5 designates the current flow resulting from the surface recombination) in a high temperature operation test. This will result in the deterioration in the current gain.

As described above, securing reliability against the surface recombination current is a large problem in practical usage applying AlGaAs/GaAs type HBT's to high speed devices or a large-output power amplifiers.

In addition, the following manufacturing problems present themselves in producing in large quantity guard ring structures using an AlGaAs passivation layer.

It has been reported that an error in etching the emitter layer requires to be controlled within the scope of at least ±50 Å when the carrier concentration in the emitter layer assumes $5 \times 10^{17}$ cm$^{-3}$ to form the AlGaAs passivation layer for high speed devices or the like (Solid State Electronics, Vol. 35, No. 7, pp. 891–895, 1992). However, the surface of the InGaAs contact layer 9 in HBT shown in FIG. 5 is distanced from an interface between the emitter layer and the base layer generally by about 3000 Å. Besides, for the epitaxial growth method for forming the HBT doped with carbon an error in the standard uniformity in the most general MOCVD method is ±5%. Consequently an error resulting from the preparation of an epiwafer assumes about ±150 Å. In addition, for the control of the etching process, several percent error is added to the above 5% error. Thus it is extremely difficult to secure a target thickness of ±50 Å or less with respect to the entire surface of the wafer. Thus we cannot help saying that the current manufacturing technique can hardly allow producing on a large production level HBT's based on a good consideration of a reliability with the AlGaAs passivation in a good yield ratio.

Next at a thin single emitter layer of undoped InGaP, selective etching is made possible. Thus compared with the formation of the above AlGaAs passivation layer, formation of the guard ring structure is easy (IEEE ELECTRON DEVICE LETTERS, Vol. 13, No. 4, pp. 214–216, APRIL 1992). However, the presence of a undoped InGaP layer notch in the conduction band induces an increase in a resistance at the emitter layer, which impairs the device properties of the transistors when operated with a large amount of current. Thus even the emitter structure of InGaP cannot be introduced as a high performance HBT.

SUMMARY OF THE INVENTION

This invention has been made in view of the above problems.

Accordingly, the invention provides a hetero-junction bipolar transistor comprising a collector layer, a base layer and an emitter layer formed stepwise in this order wherein the emitter layer comprises a plurality of layers including an AlGaAs layer, and a passivation layer is formed at a stepwise portion between the base layer and the emitter layer, and of a material having a bandgap larger than that of the base layer, and provided with a phosphide layer on the surface thereof.

BRIEF DESCRIPTION OF THE DRAWINGS

By way of example and to make this invention clear, reference will be made with respect to the drawings in which.

DESCRIPTION OF THE PREFERRED EMBODIMENTS

This invention will be detailed with respect to preferred embodiments, but is not restricted by them.

As is already described, in GaAs and AlGaAs type HBT having a large surface recombination speed of about $5 \times 10^6$ cms$^{-1}$, the recombination current varies in accordance with a change in surface state along with the passage of time. Consequently, it is impossible to avoid the deterioration of the current gain resulting from an increase in the recombination current on the surface of the base layer. However, it is known that with respect to compounds containing phosphor in place of arsenic as a V group element the surface recombination speed is generally small. For example, InP assumes a surface recombination speed of about $10^3$ cms$^{-1}$ and GaP assumes about $10^3$ cms$^{-1}$.

The HBT of the invention may be either of a PNP-type HBT or an NPN-type HBT. Owing to the difference in transfer properties, the NPN-HBT has a better cut-off frequency $f_t$ than and thus preferable to the PNP-HBT.

Examples of N-type dopants used in this invention include Si, Sn, Ge, S, Se and Te. In addition, examples of P-type dopants include carbon, Be and Zn. Out of them it is preferable to use carbon.

The HBT of this invention has a structure in which a collector layer, a base layer and an emitter layer are laminated stepwise in this order on a semi-insulating GaAs substrate. An NPN-type HBT will be detailed hereinbelow.

As the collector layer can be used a 1500 to 8000 Å thick N-type GaAs layer in which an N-type dopant is doped in a concentration of $5 \times 10^{15}$ to $1 \times 10^{17}$ cm$^{-3}$. In addition, between the collector layer and the semi-insulating GaAs substrate, a sub-collector layer can be provided. As the sub-collector can be used a 1000 Å to 1 μm thick N-type GaAs layer in which an N-type dopant is doped in a concentration of $1 \times 10^{18}$ to $8 \times 10^{19}$ cm$^{-3}$.

Next, as the base layer can be used a 300 to 2000 Å thick P-type GaAs layer or P-type AlGaAs layer in which a P-type dopant is doped in a concentration of $5 \times 10^{18}$ to $8 \times 10^{19}$ cm$^{-3}$. Besides, the base layer may be formed of a graded composition. For example, the base layer may be either an In$_x$Ga$_{1-x}$As layer laminated from the collector layer so that X is 0.1 to 1 or an Al$_x$Ga$_{1-x}$As layer laminated so that Al ratio X is 0.1 to 1. Furthermore, between the base layer and the emitter layer can be disposed an Al$_x$Ga$_{1-x}$As graded composition layer laminated so that Al ratio X is 0 to 0.1.

Subsequently, the emitter layer preferably comprises an AlGaAs layer. More preferable emitter layer comprises (1) A 100 to 400 Å thick N-type Al$_x$Ga$_{1-x}$As graded composition layer in which an N-type dopant is doped in a concentration of $1 \times 10^{17}$ to $1 \times 10^{18}$ cm$^{-3}$ and Al content in AlGaAs varies in the range of X being from 0 to 0.35 preferably between 0.2 and 0.35 inclusive, from the side of the base layer to the side of the N-type GaAs cap layer.

(2) A 300 to 1500 Å thick N-type AlGaAs layer in which an N-type dopant is doped in a concentration of $1 \times 10^{17}$ to $1 \times 10^{18}$ cm$^{-3}$.

(3) A 100 to 400 Å thick N-type Al$_x$Ga$_{1-x}$As graded composition layer in which an N-type dopant is doped in a concentration of $1 \times 10^{17}$ to $1 \times 10^{18}$ cm$^{-3}$ and Al content varies in the range of X being from 0.35 (preferably between 0.35 and 0.2) to 0, the above three layers being laminated in this order.

Figure 8:
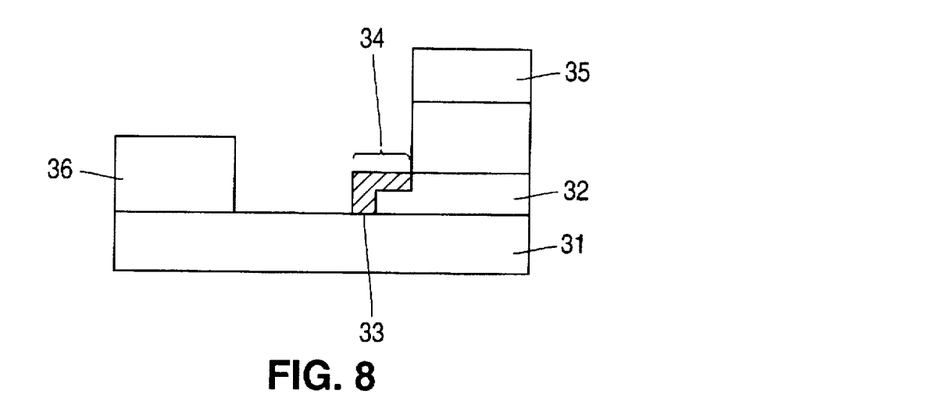
FIG. 8 is a view showing the position relations between the emitter layer, a base layer, the passivation layer and the phosphide layer.
Figure 9:
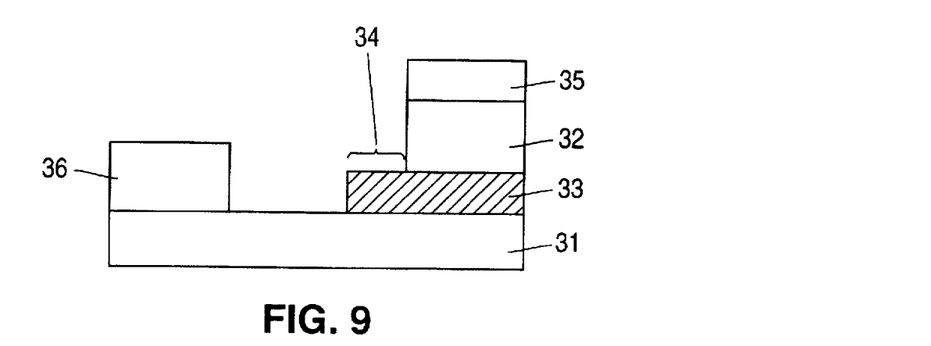
FIG. 9 is a view showing the position relations between the emitter layer, a base layer, the passivation layer and the phosphide layer.
Figure 10:
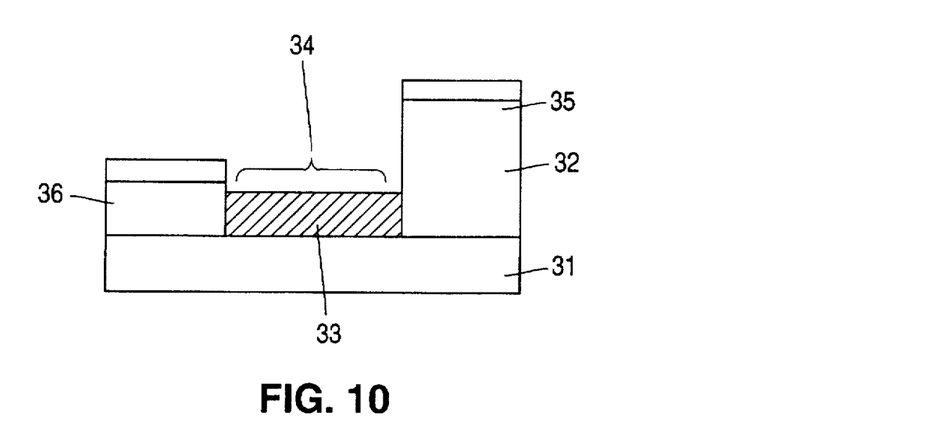
FIG. 10 is a view showing the position relations between the emitter layer, a base layer, the passivation layer and the phosphide layer.

FIG. 8 through FIG. 10 show an example of the construction of a passivation layer and a phosphide layer in accordance with the present invention.

At the outset, referring to FIG. 8, an emitter layer 32 is formed which has a width wider than an emitter electrode 35. A portion exposed out of the emitter electrode 35 serves as a passivation layer 34. In the present invention, the surface of the passivation layer 34 required to be covered with a phosphide layer 33 (shaded portion in the drawings).

Thus the passivation layer is preferably constructed so as to cover the entire surface of the base layer located between the base electrode and the emitter layer. This construction is particularly advantageous when a distance between the base electrode and the emitter layer is short. Furthermore, the passivation layer may extend over to the lower portion of the base layer as shown by Reference Numeral 5 in FIG. 1. Preferably such construction facilitates the manufacturing process of transistors.

Preferably, the phosphide layer 33 also covers the base layer 31 where the passivation layer 34 does not exist. Furthermore, the phosphide layer 33 also covers the side wall of the emitter layer. The phosphide layer may be formed by laminating an InGaP layer or the like or substituting As in AlGaAs with phosphor where a plasma treatment with a phosphide gas ($PH_3$ gas or the like) is used.

Subsequently, FIG. 9 and FIG. 10 show a construction in which a phosphide layer 33 is used as a passivation layer 34. In other words, FIG. 9 shows a construction in which an emitter layer 32 is laminated after a phosphide layer 33 is laminated on a base layer 31. In such construction, a portion extending over the base layer 31 serves as a passivation layer 34. The passivation layer 34 may cover the base layer 31 or may extend over to a portion below a base electrode 36.

In addition, FIG. 10 shows a construction in which a phosphide layer 33 is laminated between a base electrode 36 and an emitter layer 32. The phosphide layer 33 serves as a passivation layer 34. In addition, the passivation layer 34 may extend over to a portion below the base electrode 36. Preferably, the phosphide layer shown in FIG. 9 and FIG. 10 comprises III–V group elements, more preferably InGaAsP or InGaP.

Here, for example, when an InGaP layer is used, the above mentioned N-type AlGaAs graded composition layer (1) can serve as an N-type InGaP layer. This N-type InGaP layer is doped with an N-type dopant to a concentration of $1 \times 10^{17}$ to $1 \times 10^{18}$ $cm^{-3}$. The thickness of the layer needs to be set so that the thickness thereof is thinner than the combined thickness of both the InGaP surface depletion layer and the base/emitter junction depletion layer. In other words, in an operation in which sequential bias of 1V or more is applied to the base/emitter junction having a large current density, the thickness of the depletion layer of the base/emitter junction can be virtually ignored because it assumes an extremely small value.

Furthermore, the thickness of the surface depletion layer can be ignored. In addition, the thickness of the depletion layer is about 900 Å. The value can be generally calculated with a formula $(2\epsilon V_{bi}/qN_D)$ where $\epsilon$ represents a dielectric rate, $V_{bi}$ a diffusion potential, q an elementary quantity of electric charge and $N_D$ a doner density. Here, assuming that $V_{bi}$ is set the surface Fermi level pinning same as the GaAs, a formula $V_{bi}=0.6V$ is established (in case where the carrier concentration in the emitter layer assumes $1 \times 10^{17}$ $cm^{-3}$). Thus the upper limit of the thickness of the InGaP layer is about 900 Å whereas the lower limit thereof is preferably set to more than about 30 Å in terms of securing durability in annealing (for example 10 minutes annealing at 800° C.).

Subsequently on said emitter layer may be formed as a cap layer a 1000 to 3000 Å thick N-type GaAs layer in which an N-type dopant is doped in a concentration of $1 \times 10^{18}$ to $1 \times 10^{19}$ $cm^{-3}$.

On the above cap layer may be formed as a contact layer a 500 to 2000 Å N-type InGaAs layer in which an N-type dopant is doped in a concentration of $1 \times 10^{19}$ to $4 \times 10^{19}$ $cm^{-3}$.

The above mentioned layers can be laminated in accordance with a conventional method such as metal organic chemical vapor deposition (MOCVD) method and molecular beam epitaxial (MBE) method.

The emitter layer is then etched to form a base electrode. When the graded composition emitter layer is used as a passivation layer, it is etched to be exposed. In case of using AlGaAs as the graded composition emitter layer, it can be formed by etching with a phosphoric acid etchant (for example, $H_3PO_4:H_2O_2:H_2O$) and then with an HF etchant to expose the graded composition emitter layer. Here a sulfuric acid etchant can be used in place of the phosphoric acid etchant. Also, when the graded composition emitter layer comprises InGaP, the InGaP emitter layer can be exposed with the phosphoric acid etchant.

Next, a phosphide layer can be formed in the following way. The substrate subjected to the above etching is placed in a plasma CVD apparatus. Then, a mixed gas comprising phosphide such as $PH_3$ diluted to 10% with Ar is allowed to flow in this plasma CVD apparatus followed by applying a radio wave or a microwave thereby generating a glow discharge of mixed gas and treating the etched portion for 10 to 120 minutes with plasma thus generated. At this time, preferably the pressure in the plasma CVD apparatus is set to several Torr or less, the plasma power density to 0.1 to 1 $W/cm^2$, and the substrate temperature to 150° to 300° C.

In this treatment, As atoms are substituted in the region of several hundred Å and a phosphide layer can be formed.

Then to a collector electrode, an etchant is used which comprises phosphoric acid and hydrogen peroxide to expose a sub-collector layer with etching.

Next, a known photo process is used to form respective ohmic electrode for the emitter, the base and the collector thereby obtaining a transistor of this invention. As materials to be used for electrodes, known materials can be used which can be formed by laminating by sputtering method such materials as Au/Ge/Ni/Au and Ti/Pt/Au.

The above passage describes the NPN-type HBT, but the PNP-type HBT can be formed in the same manner.

EXAMPLE 1

As an example of this invention, a process for manufacturing an AlGaAs/GaAs HBT shown in FIG. 1 will be detailed hereinbelow. At the outset, an epiwafer comprising layers 2 through 9 was grown on a semi-insulating GaAs substrate 1 with the MOCVD method.

Here, Reference Numeral 2 designates a 5000 Å thick N-type GaAs sub-collector layer in which an N-type Si was doped in a concentration of $5 \times 10^{18}$ $cm^{-3}$, 3 a 5000 Å thick N-type GaAs collector layer in which N-type Si was doped in a concentration of $5 \times 10^{16}$ $cm^{-3}$, 4 a 800 Å thick P-type GaAs base layer in which a P-type C was doped in a concentration of $2 \times 10^{19}$ $cm^{-3}$, 5 a 300 Å thick AlGaAs graded composition emitter layer (Al content is from 0 to 0.3) in which N-type Si was doped in a concentration of $5 \times 10^{17}$ $cm^{-3}$, 6 a 1000 Å thick N-type AlGaAs emitter layer in which N-type Si was doped in a concentration of $5 \times 10^{17}$ $cm^{-3}$, 7 a 300 Å thick N-type AlGaAs graded composition emitter layer (Al content is from 0.3 to 0) in which N-type Si was doped in a concentration of $5 \times 10^{17}$ $cm^{-3}$, 8 a 1000 Å thick N-type cap layer in which N-type Si was doped in a concentration of $5 \times 10^{18}$ $cm^{-3}$, and 9 a 1000 Å thick N-type InGaAs contact layer in which N-type Si was doped in a concentration of $2 \times 10^{19}$ $cm^{-3}$.

Subsequently, the emitter layer of epiwafer providing the above layers 2 through 9 was subjected to mesa etching process using a phosphoric acid etchant ($H_3PO_4:H_2O_2:H_2O=3:1:50$) and then an HF etchant. Such mesa etching exposed an N-type AlGaAs layer 5 having a thickness of 500 Å or less.

Then an emitter electrode 12 was formed with the known photo process method.

This wafer was carried into a plasma CVD apparatus. In the plasma CVD apparatus, 13.56 MHz high frequency was used to generate a glow discharge in the atmosphere of a mixed gas of $PH_3$ and Ar to treat the wafer surface exposed with the generated plasma for 30 minutes. At this time, the pressure in the reactor in the CVD apparatus assumed 0.2 Torr. Then $PH_3$ diluted to 10% with Ar was flowed at a flow rate of 20 sccm. The plasma power density was set to 0.2 W/cm$^2$ and the substrate temperature to 250° C. In this treatment, a large quantity of P atoms substituted As atoms in a several hundred angstrom thick region of the side wall of the emitter layer (5,6,7), of the cap layer 8, of the contact layer 9 and of the surface of the base layer. Thus a phosphide layer 14 was formed. After the base layer and the collector layer was mesa-etched, ohmic electrodes for the base and the collector were formed. Thus the HBT shown in FIG. 1 was device isolated and packaged.

Figure 1:
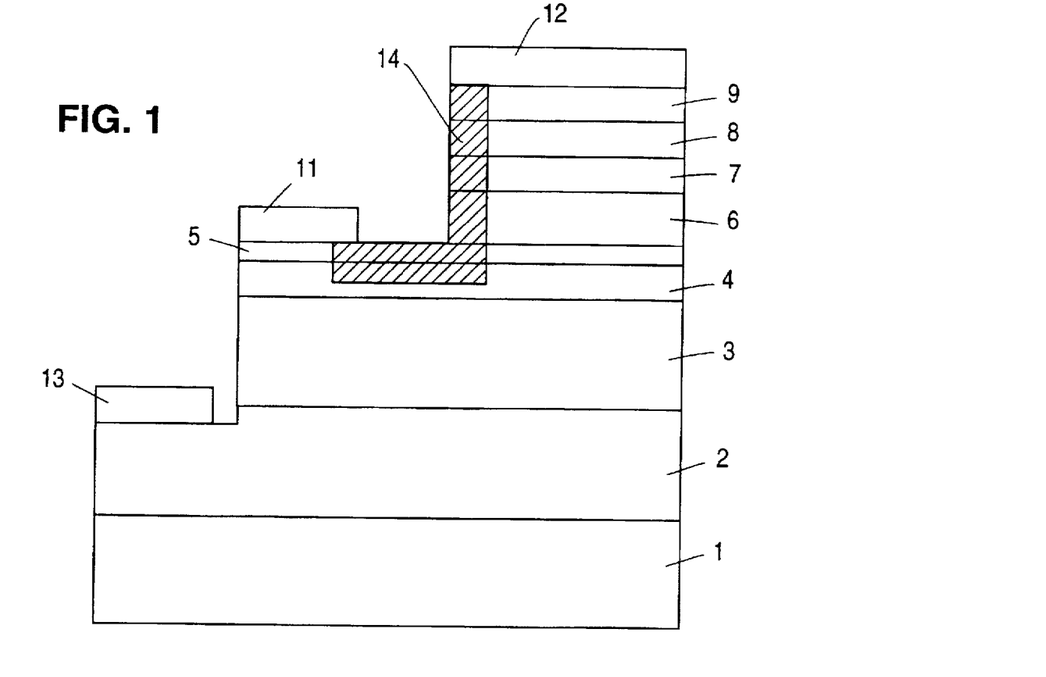
FIG. 1 is a structural sectional view of an HBT of this invention.

Furthermore, referring to FIG. 1, all the layers up to the base layer 4 are phosphitized, but the base layer 4 needs not be phosphitized.

In addition, referring to FIG. 1, the $Al_xGa_{1-x}As$ graded composition emitter layer 5 serves as a passive layer. Alternatively, the $Al_xGa_{1-x}As$ graded composition emitter layer 5 and part of the AlGaAs emitter layer 6 in combination can serve as a passive layer.

Incidentally, as a comparison sample, an HBT was made of the completely same epiwafer in the same device manufacturing process as Example 1 except that the $PH_3$ plasma treatment was not performed. There was no difference between the two in initial properties of the HBT. However, when the two HBT's having ten devices were subjected to two operation tests at 250° C., under bias condition of a collector current density of $5 \times 10^4$, the comparison samples which were not subjected to $PH_3$ plasma treatment exhibited a deterioration of current gain to 50% or less in all elements after 50 to 150 hours. On the other hand, in the samples of the invention which were subjected to $PH_3$ plasma treatment exhibited a change in the current gain of all 10% or less after 1000 hours.

In the case of the HBT shown in FIG. 1, a phosphide layer 14 was formed at least on the side wall of the emitter layer as well as in the neighborhood of the base layer surface located between the side wall of the emitter layer and the base electrode. Both GaAs base layer 4 and an AlGaAs graded composition emitter layer 5 were not directly exposed. Since this phosphide layer 14 serves as a passivation film, it was possible to prevent a change in the surface level owing to the oxidation of the surface of the AlGaAs layer and the formation of an unstable crystal defect owing to the recombination current. Thus it was not necessary to use an AlGaAs passivation structure that required finely controlled emitter layer etching. In addition, an undesirable increase in base resistance was not generated. Furthermore, a high current density operation at high temperature did not generate a leak resulting from a deterioration of the surface layer thus enabling a large stabilization in the current gain.

EXAMPLE 2

Figure 2:
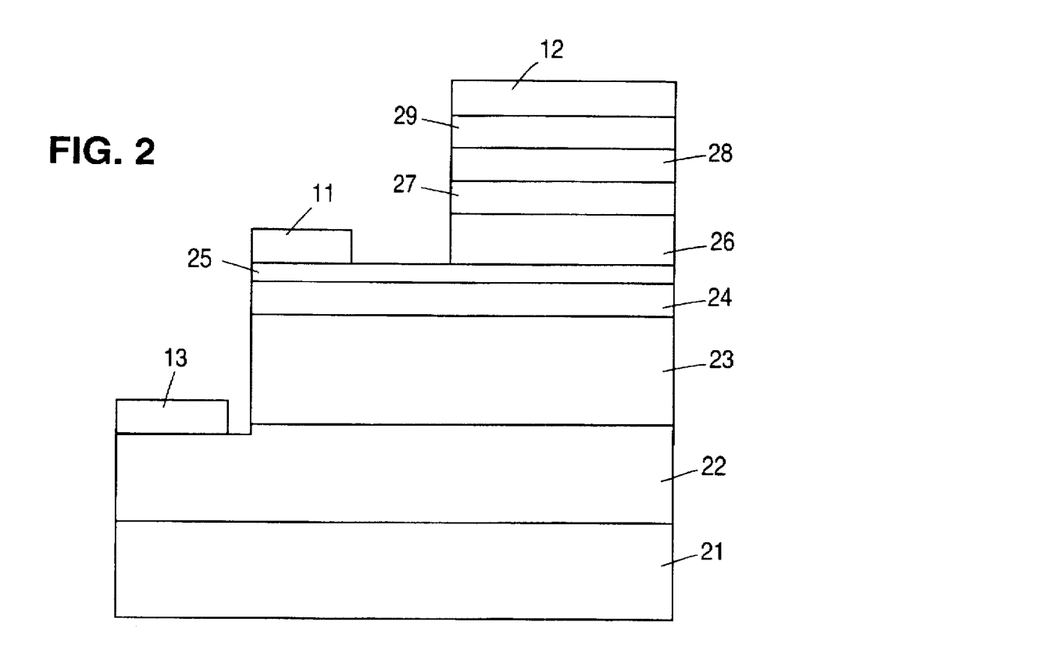
FIG. 2 is a structural sectional view of an HBT of this invention.

Detailed description would be given hereinbelow on a process for manufacturing an AlGaAs/InGaP/GaAs HBT of this invention as shown in FIG. 2.

At the outset, on a semi-insulating GaAs substrate 21 was grown an epiwafer providing layers 22 through 29 with the MOCVD method. Here, Reference Numeral 22 designated a 5000 Å thick N-type sub-collector layer in which an N-type Si was doped in a concentration of $5 \times 10^{18}$ cm$^{-3}$, 23 a 5000 Å thick N-type GaAs collector layer in which an N-type Si was doped in a concentration of $5 \times 10^{16}$ cm$^{-3}$, 24 a 800 Å thick P-type GaAs base layer in which P-type C was doped in a concentration of $2 \times 10^{19}$ cm$^{-3}$, 25 a 200 Å thick N-type $In_{0.5}Ga_{0.5}P$ emitter layer in which N-type Si was doped in a concentration of $5 \times 10^{17}$ cm$^{-3}$, 26 a 1000 Å thick N-type AlGaAs emitter layer in which N-type Si was doped in a concentration of $5 \times 10^{17}$ cm$^{-3}$, 27 a 300 Å thick N-type graded composition $Al_xGa_{1-x}As$ (the Al ratio X was from 0.27 to 0) emitter layer in which N-type Si was doped in a concentration of $5 \times 10^{17}$ cm$^{-3}$, 28 a 1000 Å thick N-type GaAs cap layer in which N-type Si was doped in a concentration of $5 \times 10^{18}$ cm$^{-3}$, and 29 a N-type InGaAs contact layer in which N-type Si was doped in a concentration of $2 \times 10^{19}$ cm$^{-3}$.

In the subsequent process, an $In_{0.5}Ga_{0.5}P$ layer was exposed with the mesa etching of the emitter layer of epiwafer using phosphoric acid etchant ($H_3PO_4$:$H_2O_2$:$H_2O$= 3:1:50) thereby forming an InGaP passivation layer. After the base layer and the collector layer were subjected to mesa etching, each ohmic electrode was formed for the emitter, the base and the collector with the known photo process to isolate and package the HBT. Ten devices of the HBT manufactured in Example 2 were subjected to an operation test like Example 1 of the HBT. A change in the current gain after 1000 hours was all 10% or less.

Since such HBT does not use a conventional epitaxial structure formed of InGaP single layer but adopts an epitaxial structure formed of at least two layers, for example, an AlGaAs layer and an InGaP layer in Example 2, the HBT can be subjected to selective etching. In addition, a guard ring structure having InGaP as a surface passivation layer can be easily formed without controlling mesa etching of the emitter layer in a very fine manner.

Figure 6:
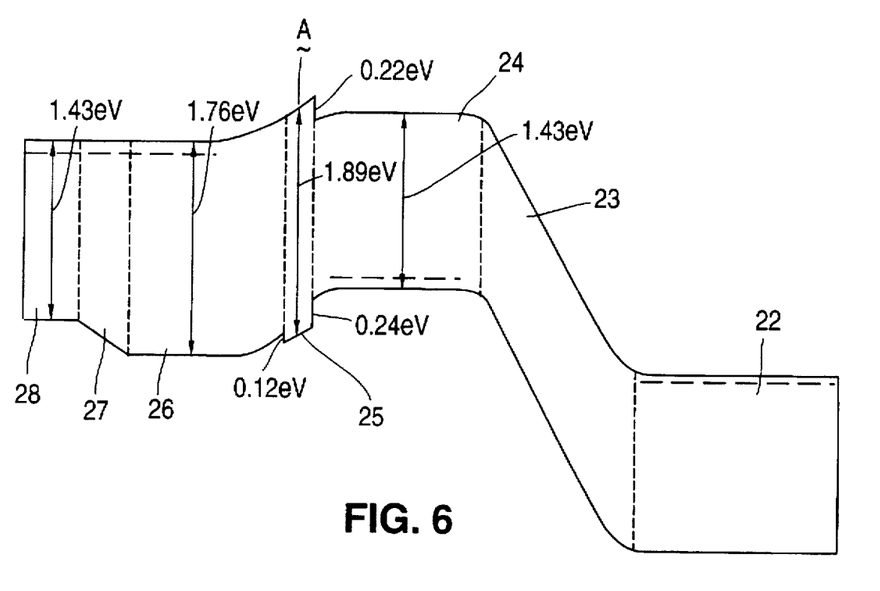
FIG. 6 is a view on an energy band in example 2.
Figure 7:
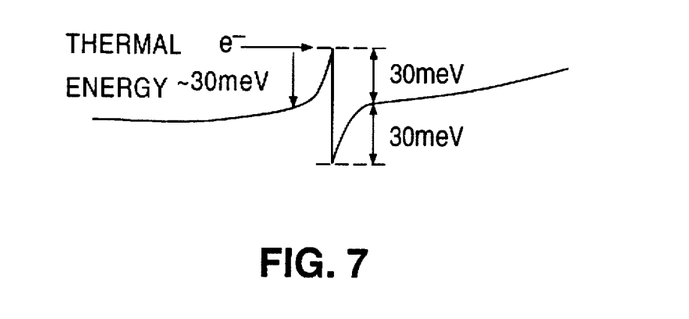
FIG. 7 is an enlarged view of part A in the view on the energy band of FIG. 6.

Since it is possible to introduce graded composition AlGaAs structure (for example, structure in which the Al ratio increased from 0 to 0.27), the Al ratio can be selected to the range of 0.20 to 0.35 to make the range to approximately agree with 0.22 eV, which is a band discontinuous value of the InGaP and GaAs conduction band. Thus the InGaP and the GaAs conduction band can be set to eliminate the discontinuity. Setting the two conduction bands in such a manner allows decreasing the emitter resistance and the off-set voltage. FIG. 7 is a more detailed illustration of the curve shown in FIG. 6 at reference A.

Since it is known that when the discontinuous value of the AlGaAs and the GaAs conduction band is (0.81×x) eV (where x is a Al ratio), a case in which the ratio agrees with a discontinuous value of 0.22 eV when formula X=0.27 is established. FIG. 6 shows a view on the energy band thereof. Thermal energy at room temperature (300 K) assumes about 30 meV. The band view of the HBT shows that if a barrier has energy of 60 meV which is two times as large as this thermal energy, this does not lead to an increase in the emitter resistance. Consequently, by selecting the Al ratio x to 0.20 to 0.35 three layer emitter structure (comprising an AlGaAs graded composition layer, an AlGaAs layer and an InGaP layer) (shown in FIG. 6) can be constituted thereby making it possible to realize an HBT with a guard ring structure using a selective etching.

In the case of Example 1 of HBT, after the emitter layer is subjected to mesa etching, a $PH_3$ plasma treatment forms a phosphide layer 14 at least on the side wall of the emitter layer and in the neighborhood of the surface of the base layer between the side wall of the emitter layer and the base electrode. Consequently, neither the GaAs base layer 4 nor the AlGaAs graded composition emitter layer 5 are not directly exposed.

Therefore it is possible to avoid the formation of an unstable surface depletion layer that can produce a change in the surface level due to oxidation of the AlGaAs layer surface and a crystal defect by the recombination current. This eliminates the need of using an AlGaAs passivation structure which requires finely controlled emitter layer etching. The manufacturing process of such emitter layer was conventionally very difficult. This does not lead to an undesired increase in the base resistance which could have been resulted from the formation of a passivation layer. Even in high current density operation at high temperatures a leak is not generated which could have been resulted from a deterioration of the surface layer. Thus a current gain can be largely stabilized.

In the case of the HBT as shown in Example 2, an epitaxial layer using the conventional InGaP single layer is not used. When the HBT is composed of an emitter layer at least comprising AlGaAs and InGaP, a selective etching can be made possible. Thus without finely controlled mesa etching of the emitter layer, an HBT involving InGaP as a surface passivation layer can be formed. In addition, it is possible to adopt graded composition structure of AlGaAs layer extending from the contact layer over to the emitter layer, both the emitter resistance and the off-set voltage can be decreased thereby making it possible to largely stabilize the HBT when operating it at a high current density.

An AlGaAs/GaAs HBT and an AlGaAs/InGaP/GaAs type HBT in accordance with the present invention do not expose a base layer comprising either GaAs or AlGaAs having a large surface recombination speed. They use a method of replacing such substance with a chemically stable phosphide. They exhibit a structure suitable for manufacturing an element.

The present invention thus being described with particular reference to the preferred embodiment thereof, it is to be understood that various modifications are possible without departing from the spirit and scope of the following claims.

What is claimed is:

1. A hetero-junction bipolar transistor comprising a collector layer, a base layer and an emitter layer formed stepwise in this order on a GaAs substrate, wherein the emitter layer comprises a first emitter layer, a second emitter layer and a third emitter layer formed in this order from the base layer side, the first emitter layer having a portion extending from the second emitter layer to under a base electrode so that the extending portion of the first emitter layer is overlapped by the base electrode, said first emitter layer further comprising a layer containing phosphorus, and the layer containing phosphorus being formed in the extending portion of the first emitter layer, wherein the layer containing phosphorus is an AlGaAsP layer.

2. A hetero-junction bipolar transistor according to claim 1, wherein the layer containing phosphorus is formed by substituting a part of As in the AlGaAs layer with P by a plasma treatment.

3. A hetero-junction bipolar transistor comprising a collector layer, a base layer and an emitter layer formed stepwise in this order on a GaAs substrate, wherein the emitter layer comprises a first emitter layer, a second emitter layer and a third emitter layer formed in this order from the base layer side, the first emitter layer having a portion extending from under the second emitter layer to under a base electrode so that the extending portion of the first emitter layer is overlapped by the base electrode, and the first emitter layer comprising an AlGaAs layer and an AlGaAsP layer, and the AlGaAsP layer being formed in the extending portion of the first emitter layer.

4. A hetero-junction bipolar transistor according to claim 3, wherein the base layer comprises a p-GaAs layer, a p-AlGaAs layer or a p-InGaAs layer and at least partially contacts the AlGaAsP layer of the first emitter layer, and a p-GaAsP layer, a p-AlGaAsP layer or a p-InGaAsP layer is formed in a surface of the base layer contacting the AlGaAsP layer.

5. A hetero-junction bipolar transistor according to claim 3, wherein the second emitter layer comprises an AlGaAs layer and an AlGaAsP layer, and the AlGaAsP layer of the second emitter layer being formed in a side wall of the second emitter layer near an interface of the first emitter layer and the second emitter layer.

6. A hetero-junction bipolar transistor according to claim 3, wherein a cap layer and a contact layer are formed on the third emitter layer in this order, the second emitter layer and the third emitter layer each comprise an AlGaAs layer, an AlGaAsP layer is formed in a side wall of the second emitter layer and the third emitter layer, the cap layer and the contact layer comprise a GaAs layer and an InGaAs layer, respectively, and a GaAsP layer and an InGaAsP layer are formed in a side wall of the cap layer and the contact layer, respectively.

7. A hetero-junction bipolar transistor according to claim 3, wherein the AlGaAsP layer is formed by substituting a part of As in the AlGaAs layer with P by a plasma treatment.

* * * * *